(12) United States Patent
Nielsen et al.

(10) Patent No.: US 6,493,227 B2
(45) Date of Patent: Dec. 10, 2002

(54) COOLING APPARATUS FOR POWER SEMICONDUCTORS

(75) Inventors: Jesper Soebygaard Nielsen, Soenderborg (DK); Lars Kappel, Aarhus C (DK)

(73) Assignee: Danfoss Drives A/S, Graasten (DK)

( * ) Notice: Subject to any disclaimer, the term of this patent is extended or adjusted under 35 U.S.C. 154(b) by 0 days.

(21) Appl. No.: 09/996,214

(22) Filed: Nov. 20, 2001

(65) Prior Publication Data

US 2002/0064028 A1 May 30, 2002

(30) Foreign Application Priority Data

Nov. 24, 2000 (DE) .......................................... 100 58 574

(51) Int. Cl.[7] ................................................ H05K 7/20
(52) U.S. Cl. ......................... 361/703; 62/3.1; 165/80.3; 165/185; 165/509; 165/514; 174/16.3; 361/704; 361/707; 361/710
(58) Field of Search ......................... 62/259.2; 165/80.3, 165/185, 361, 509, 514; 174/16.3; 257/722, 718–719; 361/688–690, 694–697, 703–710, 715; 363/141, 144

(56) References Cited

U.S. PATENT DOCUMENTS 3,081,824 A * 3/1963 Macall ........................ 165/185
5,042,257 A * 8/1991 Kendrick et al. ............. 62/3.1
5,912,802 A * 6/1999 Nelson ........................ 361/695
6,050,332 A * 4/2000 Smith et al. ................ 165/185

FOREIGN PATENT DOCUMENTS

| DE | 43 22 647 | 1/1995 |
| DE | 296 02 367 | 5/1996 |
| DE | 196 28 545 | 1/1998 |
| DE | 199 00 970 | 7/2000 |
| JP | 08204369 A | 8/1996 |
| JP | 09036284 | 2/1997 |
| WO | 97/27619 | 7/1997 |

* cited by examiner

Primary Examiner—Gregory Thompson
(74) Attorney, Agent, or Firm—Altera Law Group, LLC

(57) ABSTRACT

A cooling apparatus for power semiconductors, which apparatus is essentially box-shaped, has two extruded cooling sections (14, 15) joined to each other. One of the cooling profiles (14) forms a first heat-conducting side wall (16), and the other cooling profile (15) forms a second heat-conducting side wall (17), opposite the first side wall (16), of the cooling apparatus (1). The side walls (16, 17) have cooling partitions (18, 19) formed on the inner sides of the latter, which cooling partitions bound cooling channels through which a cooling fluid can be conducted. Power semiconductors (4, 5) are to be attached to the outer sides of the side walls (16, 17) in a heat-conducting manner. In order to achieve the largest possible cooling surface of the cooling apparatus, the cooling partitions (18) formed on the first side wall (16) project between the cooling partitions (19) formed on the second side wall (17).

8 Claims, 6 Drawing Sheets

Figure 1:
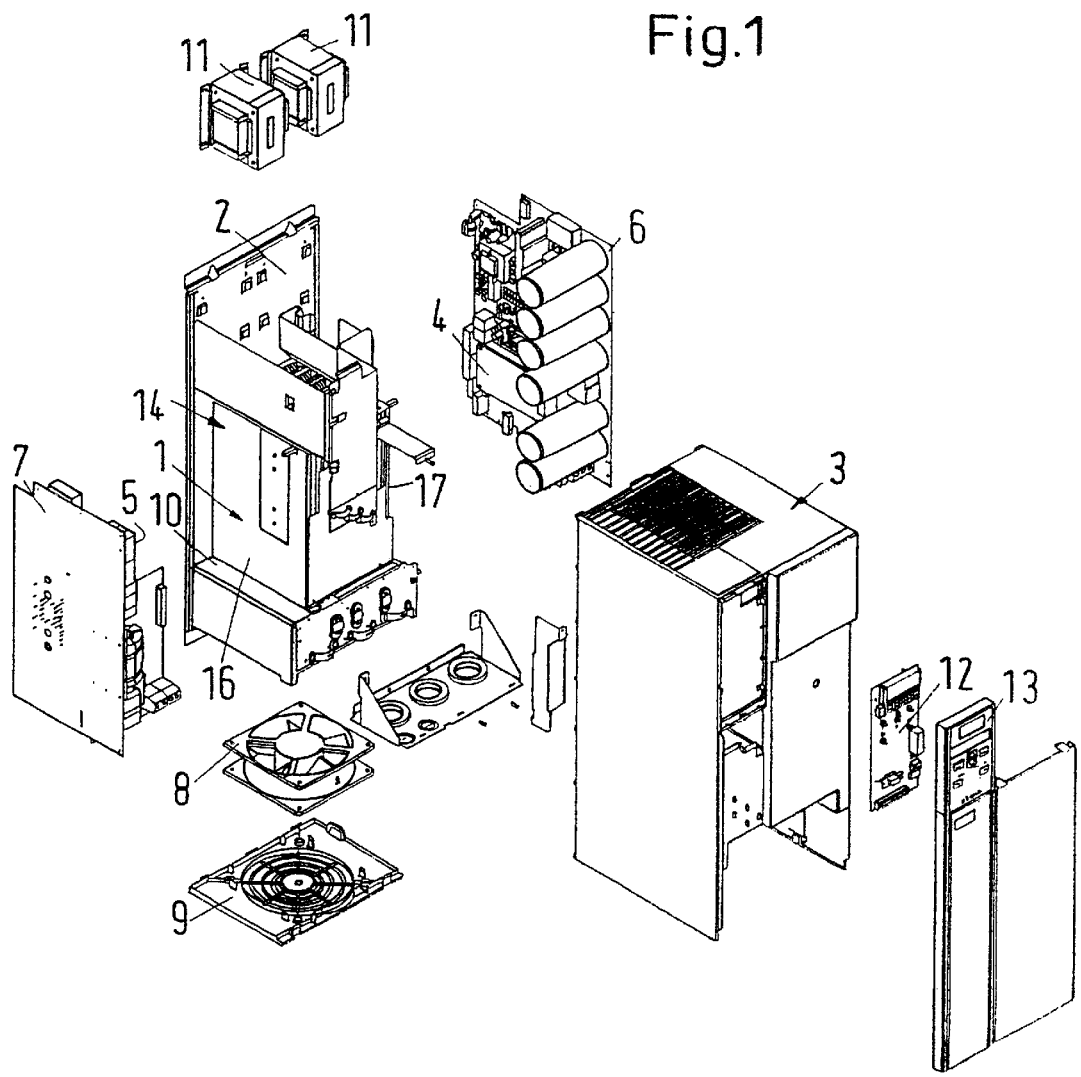

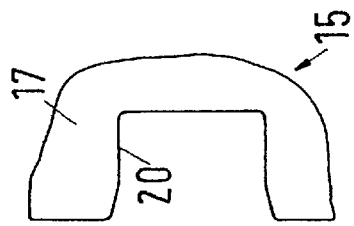
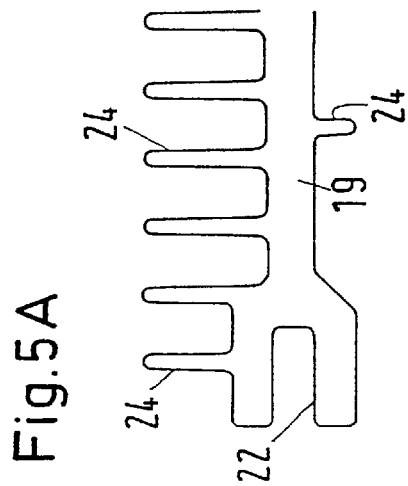
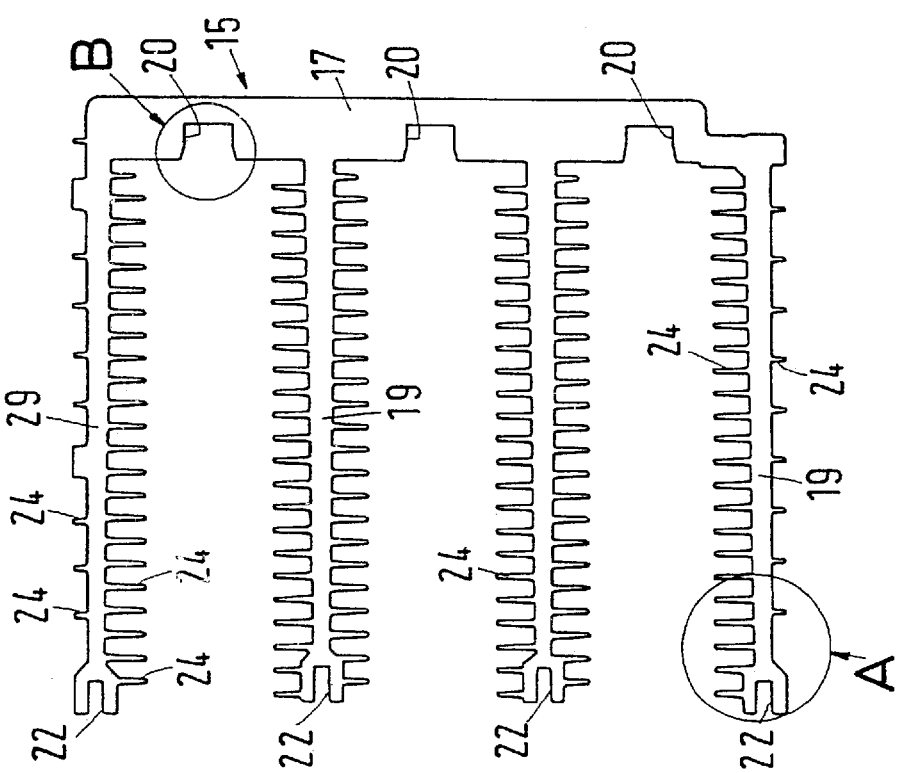

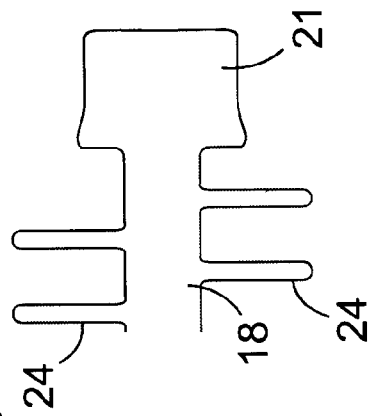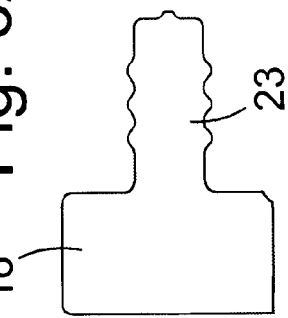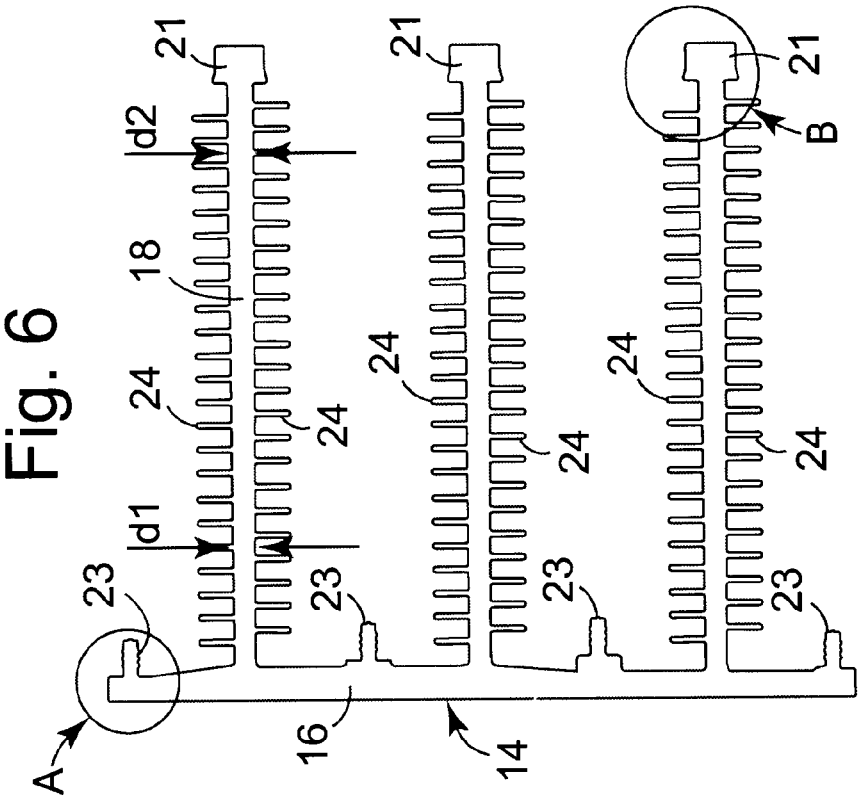

COOLING APPARATUS FOR POWER SEMICONDUCTORS

The invention relates to a cooling apparatus for power semiconductors, which apparatus is essentially box-shaped and displays two extruded cooling sections that are connected to each other, one cooling section forming a first heat-conducting side wall, and the other cooling section forming a second heat-conducting side wall opposite the first side wall. The side walls display on their inner sides integrated cooling partitions, which bound cooling channels through which a cooling fluid can be conducted. The power semiconductors are to be attached to the outer sides of the side walls in a heat-conducting manner.

The preferred field of application is power converters, in particular inverters.

In one known cooling apparatus of this type (DE 196 28 545 A1), the cooling partitions formed on the opposing side walls abut each other with their free front sides, when the cooling sections are joined to each other. In order to be able to produce the cooling sections from heat-conducting metal in an extrusion process, the cooling partitions must be situated a certain, predetermined minimum distance from each other. Through this factor, the number of cooling partitions, relative to the volume of the cooling apparatus, and thus also the total cooling surface, are limited.

The invention is based on the task of specifying a cooling apparatus, of the type named in the introduction, that ensures an effective cooling with the lowest possible volumes.

According to the invention, this task is accomplished by the fact that the cooling partitions formed on the first side wall extend between the cooling partitions formed on the second side wall.

Achieved in this solution is a smaller spacing between the cooling partitions, relative to the volume of the cooling apparatus, than hitherto. Nevertheless, the cooling sections can, furthermore, be produced with the smallest spacing between their cooling walls that is possible in the extrusion process.

Preferably, the edge regions, facing away from the first side wall, of the cooling partitions formed on the first side wall are pressed into grooves in the second side wall. In this way, the cooling sections can be joined through a simple pressing-together.

Here, the edge regions, facing away from the first side wall, of the cooling partitions formed on the first side wall, can form a bulb. This results in a larger heat-transfer surface between the second side wall and the cooling partitions formed on the first side wall, since the bulb is thicker than other regions of the cooling partition on which it is formed.

Alternatively or in addition, the front sides, facing away from the second side wall, of the cooling partitions formed on the second side wall can display depressions, in which projections formed on the inner side of the first side wall are held fixed. When not only the cooling partitions formed on the first side wall are connected to the second side wall, but also the cooling partitions formed on the second side wall are connected to the first side wall, there results a more solid joining of the cooling sections.

When the projections are produced shorter than the depressions are deep, a compensation for measurement tolerances in the extrusion of the cooling sections is possible.

Preferably, the projections are firmly pressed into the depressions accompanied by reciprocal cold welding. By this means, there results, in a simple manner, a close and secure joining of the cooling sections also on the side of the first side wall.

Preferably, the cooling partitions are provided with cooling ribs. By this means, the effective cooling surface is increased.

Further, the two outer cooling partitions of the cooling partitions formed on the second side wall can form two additional side walls of the cooling apparatus. These outer cooling partitions thus fulfill a double function: on the one hand as a boundary of the cooling apparatus, and on the other hand the removal of heat by conduction.

Figure 2:
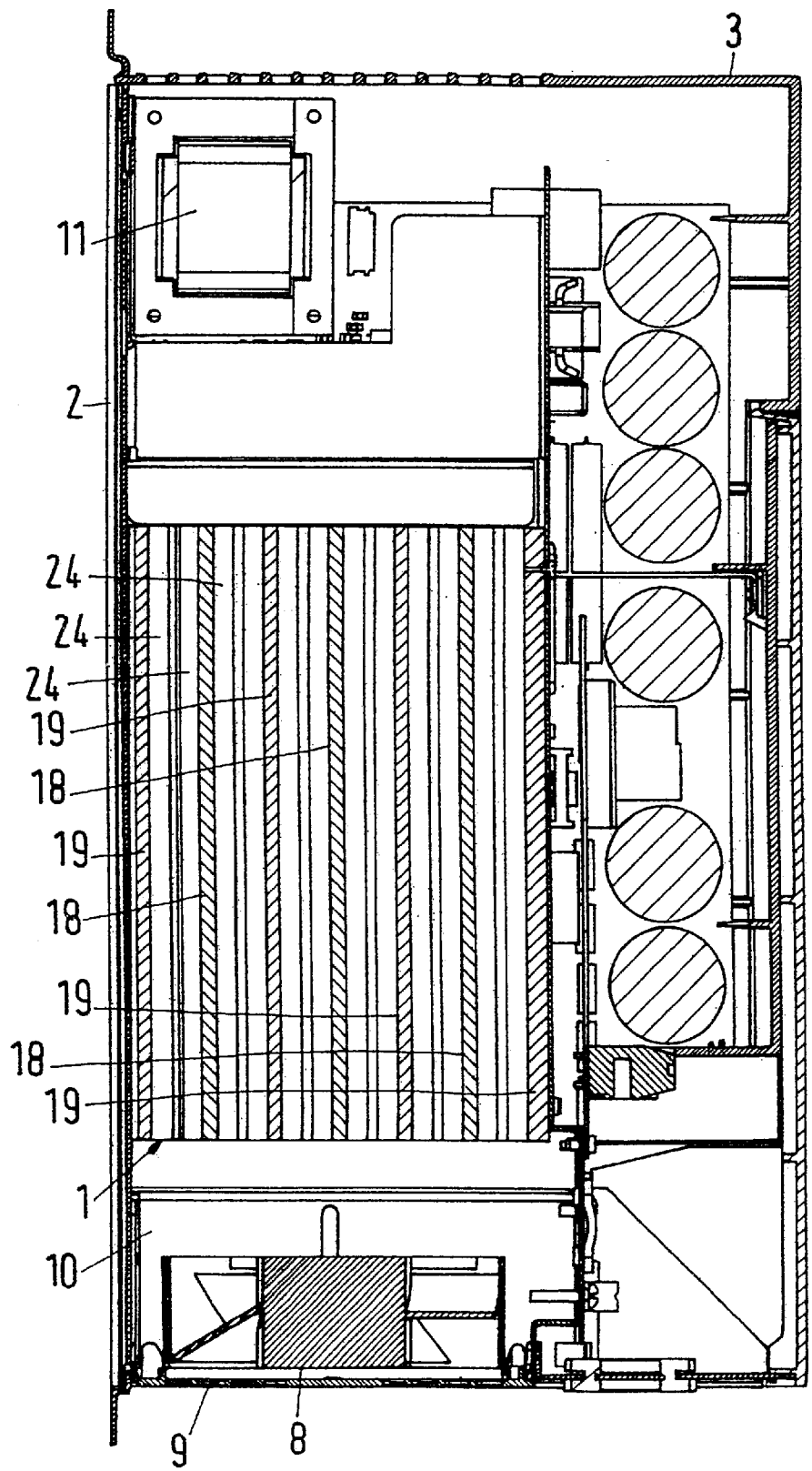
Figure 3:
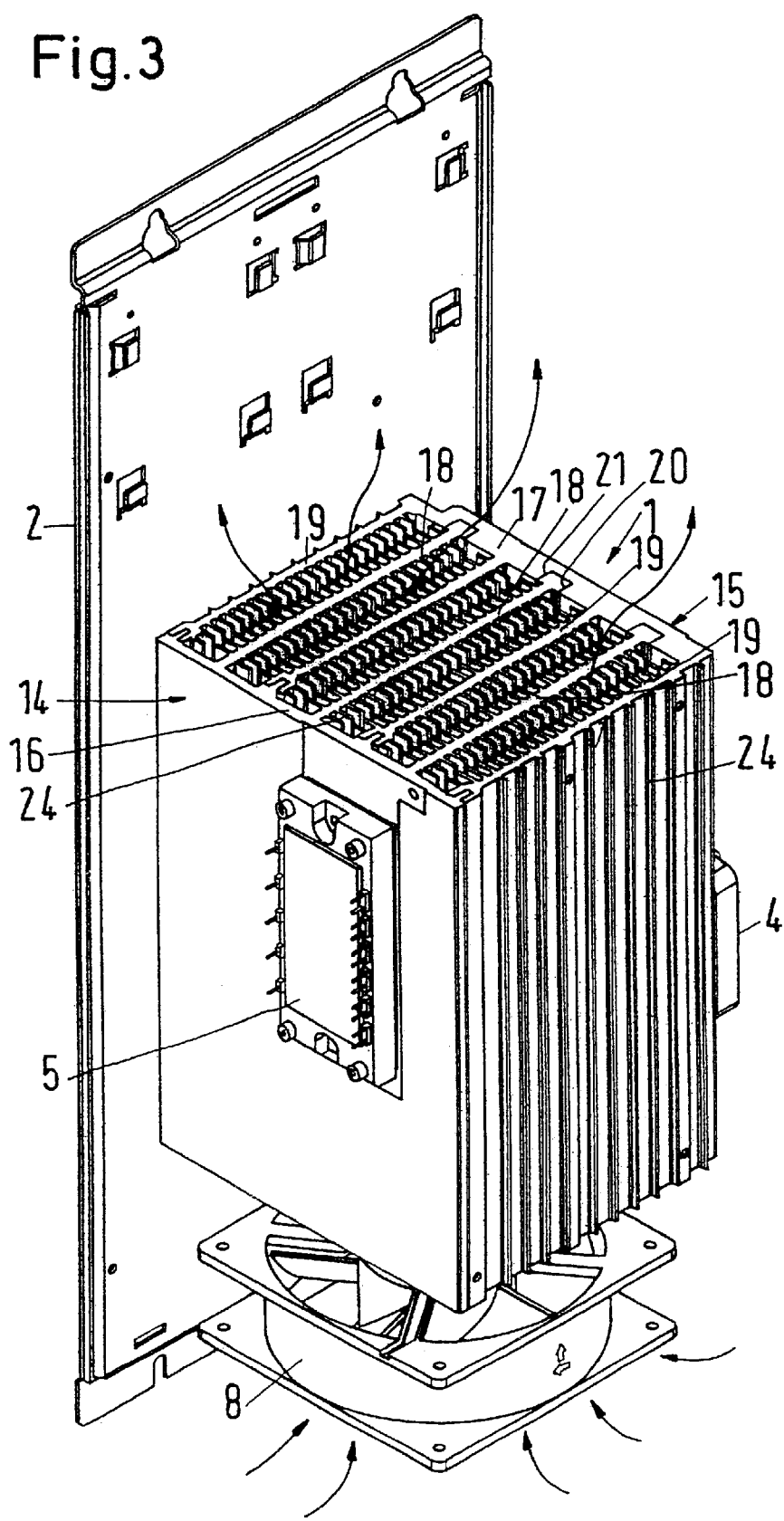
Figure 4B:
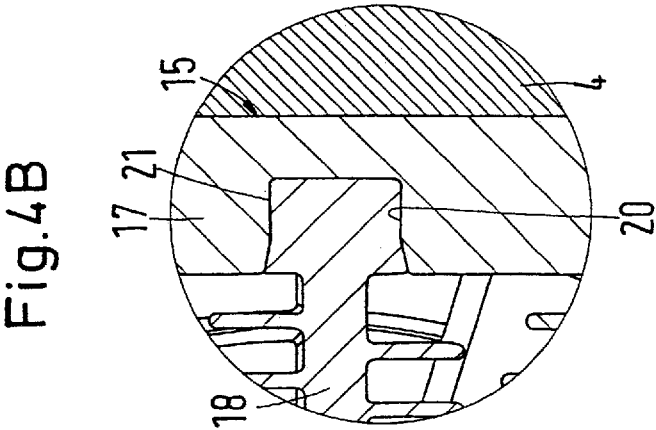
Figure 4:
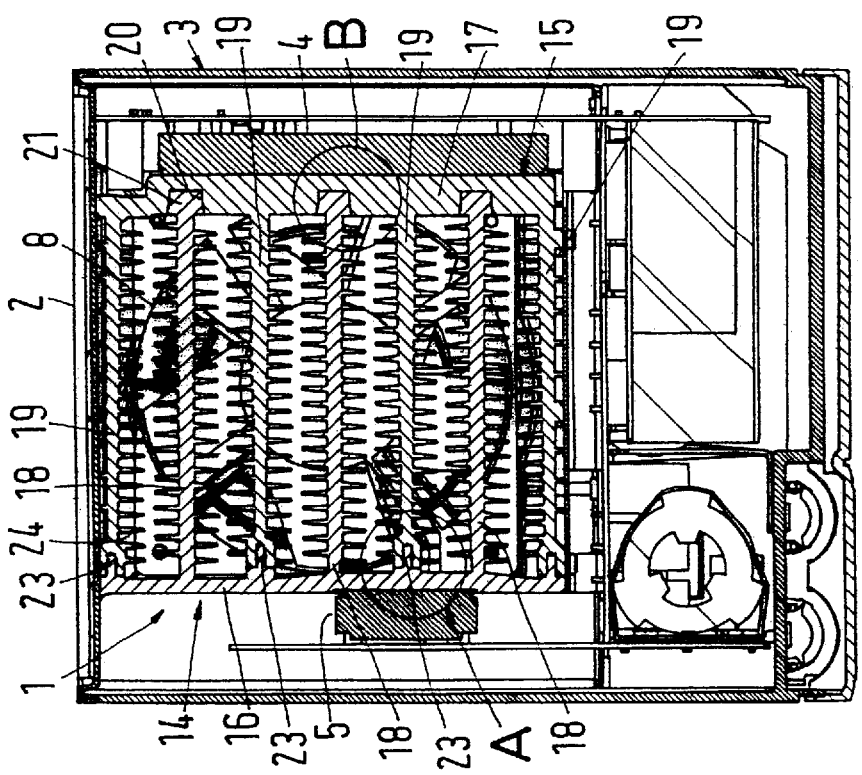
Figure 4A:
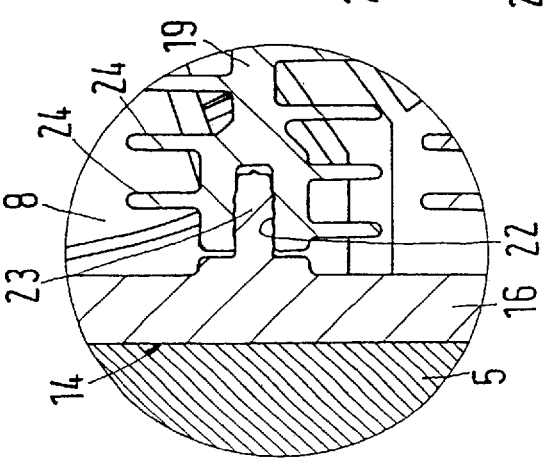

The invention and its further development are described in detail in the following, with the aid of the accompanying drawings of a preferred example of embodiment. The drawings show:

FIG. 1: an exploded representation of an inverter with a cooling apparatus according to the invention FIG. 2: a vertical section through the inverter FIG. 3: a perspective view of the cooling apparatus according to the invention, with a blower and semiconductors attached to the apparatus FIG. 4: the plan view of a horizontal section through the inverter with the cooling apparatus FIG. 4A: the detail A of FIG. 4 in enlarged scale FIG. 4B: the detail B of FIG. 4 in enlarged scale FIG. 5: a plan view of one of the two cooling sections of the cooling apparatus according to the invention FIG. 5A: the detail A of FIG. 5 in enlarged scale FIG. 5B: the detail B of FIG. 5 in enlarged scale FIG. 6: a plan view of the other cooling section of the cooling apparatus according to the invention FIG. 6A: the detail A of FIG. 6 in enlarged scale FIG. 6B: the detail B of FIG. 6 in enlarged scale The cooling apparatus represented in FIGS. 1 through 4 is arranged approximately in the center of a power converter, here an inverter, and is provided on three sides with circuit boards, to which are attached electronic components, among others power semiconductors, which must be cooled. The electronic components are shielded by a back wall 2 of sheet steel and a housing 3 of plastic.

The power semiconductors to be cooled form, on one side, an IGBT (insulated gate bipolar transistors) module 4, and on the other side, a rectifier module 5. These modules 4 and 5 are attached to circuit boards 6 and 7, respectively. The cooling apparatus 1 is cooled by a cooling fluid, here air, from a blower 8, which is attached to the bottom of the inverter. The cool air is guided through the cooling device 1 upwardly from the bottom. The blower 8 is mounted to a bottom plate 9 manufactured from plastic, which plate is fastened to the back wall 2 and to a frame 10.

The cooling apparatus 1 is fastened to the back wall 2 by means of screws. In addition, two DC intermediate-circuit choke coils 11 are attached to the back wall 2. The frame 10 is also fastened to the back wall 2 by means of screws.

The frame 10 forms the bottom of the housing 3. In the housing 3, a printed circuit board 12 with a control circuit is attached to a front operating panel 13 produced from plastic.

The cool air, indicated in FIG. 3 by flow arrows, is blown by the blower 8 upwardly from below, through the bottom plate 9, the frame 10 provided with passage holes, and cooling channels in the cooling apparatus 1, in the process of which the cool air draws the heat from the cooling apparatus. Here, nearly all of the cool air is guided through the cooling channels of the cooling apparatus 1, since it cannot escape laterally from the cooling apparatus into the electronics region. After the cool air has left the cooling apparatus 1, the cool air flows around the two DC intermediate-circuit choke coils 11, after which the cool air exits through openings in the housing 3.

The cooling apparatus 1 is essentially box-shaped and displays two cooling sections 14 and 15, which are extruded from aluminum and which can be joined to each other. The one cooling section 14 has a first side wall 16 and the other cooling section 15 has a second side wall 17 opposite the first side wall 16. Formed on the inner sides of the side walls 14 and 15 are cooling partitions 18 and 19, respectively. The cooling partitions 18 and 19 bound between themselves the above-mentioned cooling channels through which the cool air flows, and fastened to the smooth outer side of the side wall 17 in a heat-conducting manner is the IGBT module 4 with the power semiconductors in the form of "Insulated Gate Bipolar Transistors". Attached to the outer side of the other side wall 16 in a heat-conducting manner is, on the other hand, the rectifier module 5 with power semiconductors in the form of rectifiers.

The cooling partitions 18 formed on the first side wall 16 project between the cooling partitions 19 formed on the second side wall 17.

The edge regions, facing away from the first side wall 16, of the cooling partitions 18 formed on the first side wall 16 are pressed into grooves 20 in the second side wall 17. Here, the edge regions, facing away from the first side wall 16, of the cooling partitions 18 formed on the first side wall 16 form a bulb 21, which is thicker in cross section than the cooling partitions 18; cf. in particular FIGS. 5B and 6B.

The front sides, facing away from the second side wall 17, of the cooling partitions 19 formed on the second side wall 17 have depressions 22 into which projections 23 formed on the inner side of the first side wall 16 are pressed, accompanied by cold welding to the depressions 22. For this purpose, the projections 23 are undulated on their sides, see in particular FIG. 6A. In addition, the inner sides of the depressions 22 can be undulated in correspondence to the waves on the projections 23, as is shown in particular in FIGS. 4A and 6. Beyond this, the projections 23 are somewhat shorter than the depressions 22 are deep, in order to accommodate tolerances in the manufacturing (extrusion) of the cooling sections 14, 15.

The IGBT module 4 has a higher power loss than the rectifier module 5. Thus, the waste heat of the IGBT module 4 is conducted out of the side wall 17 by means of seven cooling partitions 18 and 19 by virtue, first, of the one-piece transition between the side wall 17 and the cooling partitions 19, and second, by virtue of the large-surface contact between the bulbs 21 and the grooves 20. For this purpose, the side wall 17, for absorbing and drawing off the greater waste heat of the IGBT module 4, is formed thicker than the side wall 16. Further, the cooling partitions 18 and 19 have, starting from the side wall 17, an approximately trapezoidal, diminishing horizontal cross section, so that the heat-conduction resistance of the cooling partitions 18 and 19 decreases with increasing distance from the thermally more highly-loaded side wall 17, on account of the falling temperature in this direction. Conversely, the horizontal cross section of the cooling partitions 18 and 19 increases from the side wall 16 that is thermally less highly-loaded by the rectifier module 5 to the thermally more highly-loaded side wall 17. Thus, it is also sufficient, for drawing off the lower waste heat of the rectifier module 5 via the side wall 16, to form on the latter only three cooling partitions 18 directly during the extrusion of the cooling section 14 and to afterward connect the four cooling partitions 19 formed on the side wall 17 to the side wall 16 in a material fitting manner via the depressions 22 and projections 23, by means of pressing together and cold welding.

In order to still further promote the drawing off of heat, all of the cooling partitions 18 and 19 are provided with cooling ribs 24 on both sides.

In addition, the two outside cooling partitions 19 of the cooling partitions 19 formed on the second side wall 17 form two additional side walls of the cooling apparatus 1. Thus, these outer side walls 19 not only bound the cooling apparatus 1 on the two other sides of the cross-sectionally approximately rectangular or box-shaped cooling apparatus 1, but they also simultaneously effect an outward conduction of heat.

The thermally critical power semiconductors are consequently distributed on two side walls 16 and 17 in the cooling apparatus 1. The thermal loading by the power semiconductors is therefore distributed over more than one side wall, which results in a uniform temperature distribution and thus an improved utilization of the aluminum mass of the cooling apparatus.

The smallest possible spacing of the cooling partitions is normally limited in an extrusion process to a lower limiting value. The ratio of the spacing of the cooling partitions 18, 19 to their length perpendicularly to the side walls 16, 17 is normally selected as 1:4. Through the division of the cooling apparatus into two cooling sections 14 and 15, the cooling partitions of which are inserted into each other, the effective ratio can be increased to approximately 1:6.5. This results in a larger cooling surface of the cooling apparatus relative to its total volume. By virtue of the cooling ribs 24, the total cooling surface is further enlarged considerably.

What is claimed is:

1. Cooling apparatus for power semiconductors, which apparatus is essentially box-shaped and displays two extruded cooling sections joined to each other, of which one cooling section forms a first heat-conducting side wall and the other cooling section forms a second heat-conducting side wall, opposite the first side wall, of the cooling apparatus; in this, the side walls display cooling partitions formed on the inner sides of the latter, which cooling partitions bound cooling channels through which cooling fluid can be conducted; the cooling partitions formed on the first side wall project between the cooling partitions formed on the second side wall; the first side wall displays a smaller cross section than the second side wall; and power semiconductors are to be attached to the outer side of the second side wall in a heat-conducting manner; wherein power semiconductors with lower waste heat are to be attached to the outer side of the first side wall and power semiconductors with higher waste heat are to be attached to the outer side of the second side wall, and that the cross sections of all of the cooling partitions formed on the inner sides of the side walls increase from the first towards the second side walls.

2. Cooling apparatus according to claim 1, wherein the edge regions, facing away from the first side wall, of the cooling partitions formed on the first side wall are pressed into grooves in the second side wall.

3. Cooling apparatus according to claim 2, wherein the edge regions, facing away from the first side wall, of the cooling partitions formed on the first side wall form a bulb.

4. Cooling apparatus according to claim 1, wherein the front sides, facing away from the second side wall, of the cooling partitions formed on the second side wall display depressions, in which projections formed on the inner side of the first side wall are held fixed.

5. Cooling apparatus according to claim 4, wherein the projections are shorter than the depressions are deep.

6. Cooling apparatus according to claim 4, wherein the projections are pressed fixedly into the depressions accompanied by reciprocal cold welding.

7. Cooling apparatus according to claim 1, wherein the cooling partitions are provided with cooling ribs.

8. Cooling apparatus according to claim 1, wherein the two outer cooling partitions of the cooling partitions formed on the second side wall form two additional side walls of the cooling apparatus.

* * * * *